United States Patent [19]

Raychaudhuri et al.

[11] Patent Number: 5,770,293

[45] Date of Patent: Jun. 23, 1998

[54] METHOD OF FORMING RECORDABLE OPTICAL ELEMENT USING LOW ABSORPTION MATERIALS

[75] Inventors: Pranab K. Raychaudhuri, Rochester; Fridrich Vazan, Pittsford, both of N.Y.

[73] Assignee: Eastman Kodak Company, Rochester, N.Y.

[21] Appl. No.: 631,754

[22] Filed: Apr. 12, 1996

[51] Int. Cl.[6] ............................... B32B 3/00; C23C 16/00
[52] U.S. Cl. ...................... 428/64.1; 428/64.5; 428/913; 427/248.1; 427/255.1; 427/255.5; 430/270.13; 430/495.1; 430/945
[58] Field of Search ................................. 428/64.1, 64.2, 428/64.4, 64.5, 457, 913; 430/270.12, 270.13, 495.1, 945; 369/283, 288; 427/248.1, 255.1, 255.5

[56] References Cited

U.S. PATENT DOCUMENTS

| | | | |
|---|---|---|---|
| 4,940,618 | 7/1990 | Hamada et al. | 428/64 |
| 4,985,349 | 1/1991 | Ohkawa et al. | 430/495 |
| 5,013,635 | 5/1991 | Ohkawa et al. | 430/495 |
| 5,061,563 | 10/1991 | Ohkawa et al. | 428/408 |
| 5,585,158 | 12/1996 | Raychaudhuri et al. | 428/64.1 |

FOREIGN PATENT DOCUMENTS

| | | |
|---|---|---|
| 2005520 | 12/1989 | Canada . |
| 0353393 | 7/1990 | European Pat. Off. . |

*Primary Examiner*—Patrick Ryan
*Assistant Examiner*—Elizabeth Evans
*Attorney, Agent, or Firm*—Raymond L. Owens

[57] ABSTRACT

A method of forming a recordable element including a substrate and having on its surface, in order, an optical recording layer and a light reflecting layer, the optical recording layer having at least two sublayers of different compositions is disclosed. The method includes forming in a sputtering chamber on the substrate surface a first sublayer of a predetermined thickness by sputtering at least two metal elements having Ge and Te, or alloys thereof, in a flowing environment of a hydrocarbon gas and an inert gas wherein the flow rate of the hydrocarbon gas is selected relative to the flow rate of the inert gas to provide the first sublayer with an elemental $R_{min}$ reflectivity is in the range of 40–60% and forming in the sputtering chamber on the first sublayer a second sublayer of a predetermined thickness by sputtering at least two elements having Ge and Te, or alloys thereof, in a flowing environment of hydrocarbon gas and the inert gas, with the flow rates of the hydrocarbon gas and the inert gas being substantially the same as when the first sublayer was formed and reducing the sputtering rate of the metal elements in comparison to that used when forming the first sublayer so that the elemental $R_{min}$ reflectivity of the second sublayer is in the range of about 70–85%. The method further includes forming a reflecting layer on the second sublayer and selecting the thicknesses of the first and second sublayers, and the reflecting layer such that the reflectivity of the recording element is about or greater than 70% for a laser wavelength of about 780 nm.

6 Claims, 3 Drawing Sheets

METHOD OF FORMING RECORDABLE OPTICAL ELEMENT USING LOW ABSORPTION MATERIALS

CROSS-REFERENCE TO RELATED APPLICATIONS

Reference is made to U.S. application Ser. No. 08/399,787 filed Mar. 7, 1995, pending, entitled "Recordable Optical Element Using Low Absorption Materials" by Tyan et al and U.S. application Ser. No. 08/482,718 filed Jun. 7, 1995, now U.S. Pat. No. 45,585,158, entitled "Recordable Optical Element Using Low Absorption Materials" by Raychaudhuri et al.

FIELD OF THE INVENTION

The present invention relates to methods of forming optical recording elements, particularly to those that are useful as recordable compact discs.

BACKGROUND OF THE INVENTION

There are many types of optical information carrying elements that are known. One of the popular forms of optical information containing element is the compact disc or CD. Digital information is stored in the form of low reflectivity marks or pits on an otherwise reflective background. Stringent specifications on CD formats have been published by Sony and Philips, and these formats are used as standards throughout the world. One of the most important format requirements is the background reflectivity which is specified to be greater than 70% at about 780 nm. This high reflectivity value is unusual when compared with other optical-recording discs. In the latter case, the reflectivity normally is designed to be low in order to improve the absorption of the writing laser energy to facilitate the information recording process.

In CDs, the optical information is most often in the form of read only memory or ROM. Optical information is usually not recorded in real time but rather is produced by press molding. In a typical process, the recording substrates are first mass produced by press molding using a stamper containing the digital information to be reproduced. The press molded substrate is then overcoated with a reflective layer and then with an optional protective layer. In those areas having the deformations or pits, the reflectivity is lower than in those areas not having the deformations.

It is desirable to produce optical recording elements which are capable of being recorded in real time and producing a record that mimics the conventional CD on read out. In this manner, information can be recorded on the CD and the CD can be read back by conventional CD player.

It has been difficult to produce such optical recording elements because the recorded elements have to meet the strict specifications for CD. In particular, it has been difficult to produce recordable elements that will meet the >70% reflectivity requirement.

One method for forming a recordable element that mimics conventional mold pressed CD elements is to provide a transparent, heat deformable support having thereon, in order, a layer that absorbs recording radiation and a reflective layer. When radiated through the transparent support, the reflectivity varies with the thickness of the absorbing layer as a result of the light interference effect, and 70% reflectivity may be realized at several thicknesses (FIG. 1). When an absorbing layer of very small thickness (much less than that corresponding to $R_{min}$) is used, the reflectivity is high, but such structure is not useful for recording purposes because of low thermal efficiency. The reflective layer is a very effective heat sink. Most of the writing energy absorbed next to the reflector in the optical recording layer is conducted away by the reflector. It is generally observed that the smallest useful thickness is that which produces reflectivity in the neighborhood of the first minimum in reflectance. To produce useful recording elements, therefore, requires materials which will produce >70% reflectance with thickness larger than this minimum useful thickness. Such materials are characterized by low optical absorption coefficients, contrary to the materials used in conventional recording structures where high optical absorption is preferred. These low absorption materials when used in conventional media structure without a reflector generally do not perform well. Adequate sensitivity and contrast can only be achieved when incorporated in a complete optical interference structure using the reflector. Thus, generally speaking, materials that are appropriate for conventional recording structure are not appropriate for recordable CD structure, and vice versa.

Materials of this type based on organic dyes are described in U.S. Pat. No. 4,940,618, European Patent Application 0,353,393, and Canadian Patent 2,005,520.

One of the undesirable features of elements based on such organic dyes is their wavelength sensitivity. The desirable optical properties can only be obtained at wavelengths near the absorption edges of such dyes. As a result, the reflectivity and other properties of such elements depend strongly on wavelength. It is very difficult to meet all the stringent CD specifications throughout the entire range of wavelengths that the CDs are designed to function. It is nearly impossible to operate such elements using shorter wavelengths which are to be used in future generation CDs to increase the recording density.

However, U.S. application Ser. No. 08/399,787 filed Mar. 7, 1995 included some non-dye media which have satisfied the CD specified reflectivity. One of the shortcomings of such non-dye media is their relatively low thermal efficiency. The power required to write with full contrast is significantly greater than that required for the dye based recording elements.

SUMMARY OF THE INVENTION

It is an object of this invention to provide a method for making improved recording elements with significantly higher recording sensitivity and operable at a wide wavelength range while complying with CD specifications.

This object is achieved by a method of forming a recordable element including a substrate and having on its surface, in order, an optical recording layer and a light reflecting layer, the optical recording layer having at least two sublayers of different compositions, comprising the steps of:

a) forming in a sputtering chamber on the substrate surface a first sublayer of a predetermined thickness by sputtering at least two metal elements having Ge and Te, or alloys thereof, in a flowing environment of a hydrocarbon gas and an inert gas wherein the flow rate of the hydrocarbon gas is selected relative to the flow rate of the inert gas to provide the first sublayer with an elemental $R_{min}$ reflectivity is in the range of 40–60%;

b) forming in the sputtering chamber on the first sublayer a second sublayer of a predetermined thickness by sputtering at least two elements having Ge and Te, or alloys thereof, in a flowing environment of hydrocarbon gas and the inert gas, with the flow rates of the hydrocarbon gas and the inert gas being substantially the same as when the first sublayer was formed and reducing the sputtering rate of the metal elements in comparison to that used when forming the first sublayer so that the elemental $R_{min}$ reflectivity of the second sublayer is in the range of about 70–85%;

c) forming a reflecting layer on the second sublayer; and d) selecting the thicknesses of the first and second sublayers, and the reflecting layer such that the reflectivity of the recording element is about or greater than 70% for a laser wavelength of about 780 nm.

ADVANTAGES

The method according to this invention provides:

The composition and the thickness of the optical recording layer and the reflecting layer are such that the recording sensitivity for the element is superior to a single layer disc of identical $R_{min}$ reflectivity; and The composition and the thickness of the optical recording layer and the reflecting layer are such that the recording sensitivity for the element is superior to a single layer disc of identical $R_{max}$ reflectivity.

DETAILED DESCRIPTION OF THE INVENTION

Figure 1:
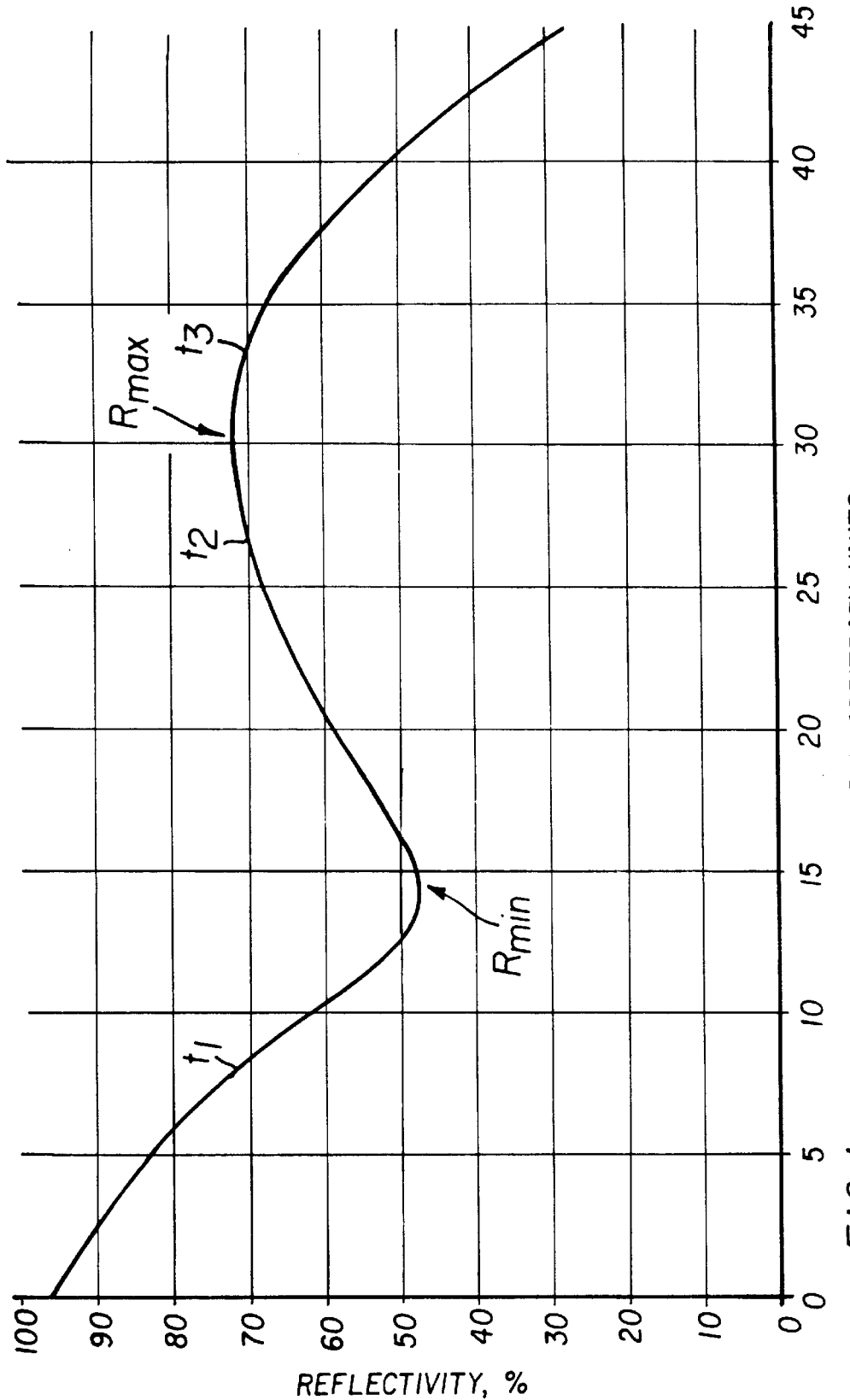
FIG. 1 is a typical plot of the reflectivity vs. the thickness of an optical recording element resulting from light intereference effects.
Figure 2:
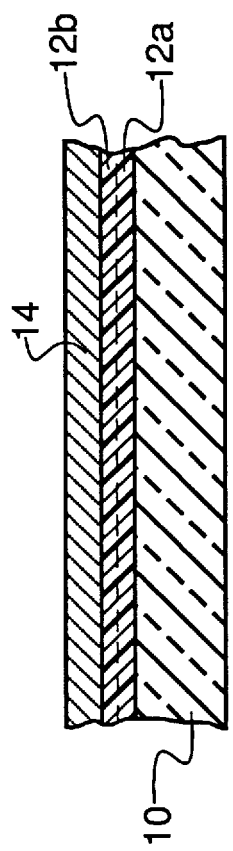
FIG. 2 is a schematic representation, in cross-section, of an optical recording element which can be made in accordance with the present invention.

Turning first to FIG. 2, there is shown an optical recording element made in accordance with the present invention.

A conventional substrate 10 which can be used in accordance with the invention typically can be made of polycarbonate, polymethylmethacrylate, or another polymer or glass.

On the substrate 10 are formed first and second sublayers 12a and 12b which will be discussed in more detail later. On the sublayer 12b there is provided a reflective layer 14.

It is an important feature of the present invention that the reflecting layer 14 and the first and second sublayers 12a and 12b of the element are selected such that the reflectivity of the recording element is greater than 70% in order to meet the CD specifications.

Figure 3:
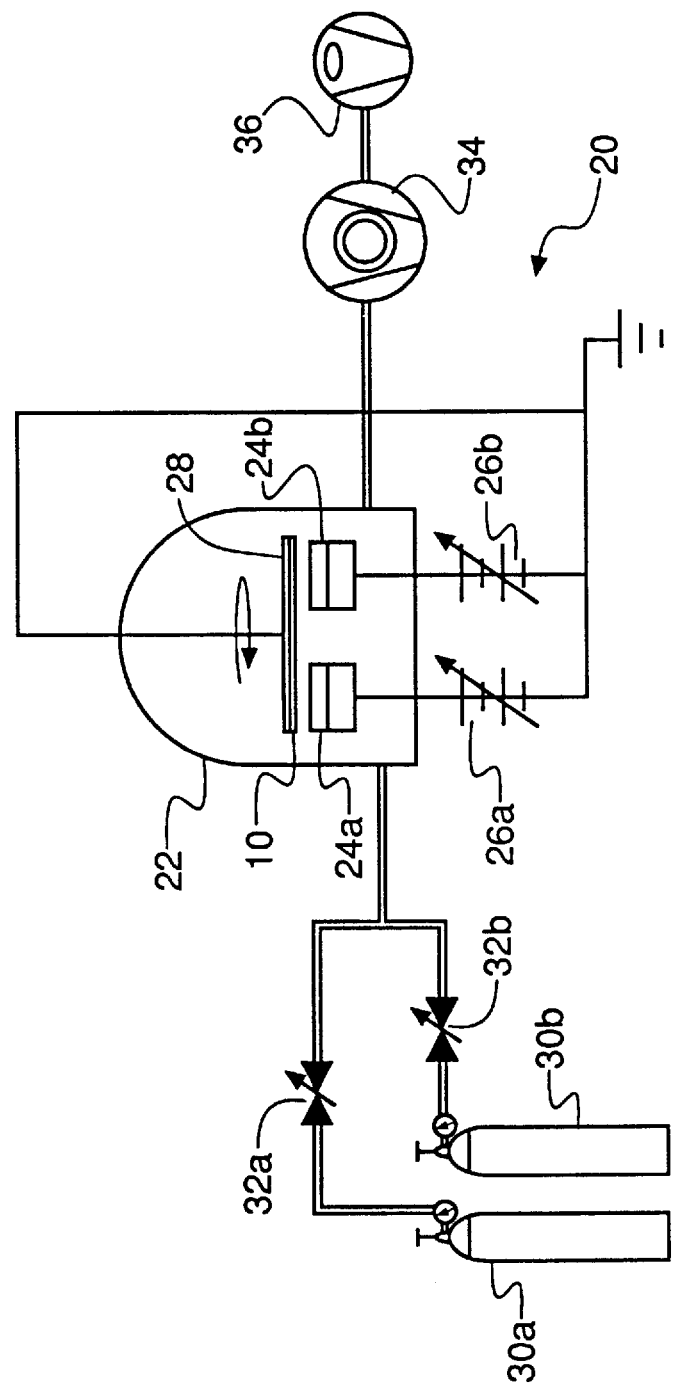
FIG. 3 is a schematic representation of apparatus which can be used to practice the present invention.

Turning now to FIG. 3 wherein apparatus 20, which can be used in accordance with the present invention, is shown. A belljar structure 22, which is conventionally used in sputtering operations, is shown.

Within the belljar 22 are two DC magnetron cathodes 24a and 24b. Upon these magnetron cathodes 24a and 24b will be disposed metal targets having elements for forming the first and second sublayers 12a and 12b, respectively. Each of the magnetron cathodes 24a and 24b is connected to its own variable DC power supply 26a and 26b, respectively. The substrate 10, which can be in the form of a disc, is disposed on a substrate holder 28 which, as shown, can rotate. This type of structure is well understood to those skilled in the art and further description of it is not necessary for understanding the present invention. The appparatus used in the invention is connected to two sources of gases. The two gas sources 30a and 30b are hydrocarbon gas, preferably methane, and an inert gas, preferably argon, respectively. Connected to the gas source 30a is a mass flow controller 32a and connected to the inert gas source 30b is a mass flow controller 32b. By adjusting the mass flow controllers, the flow rate of the gases can be controlled. Further, there are shown a turbomolecular pump 34 and a mechanical pump 36, both of which in combination are used to evacuate the belljar and to maintain the required pressure as is well understood in the art.

In order to practice the present invention, a substrate 10 is placed on the substrate holder 28 which is positioned over the first and second magnetron cathodes 24a and 24b. On the magnetron cathode 24a there is provided a target having a metal element having Ge, and on the other cathode 24b there is provided another target having Te. Alternatively, an alloy target of both Ge and Te can be provided on a single magnetron cathode. In operation, the power delivered to the magnetron cathodes 24a and 24b by power supplies 26a and 26b, respectively, is adjusted and the flow rates of the hydrocarbon gas and the inert gas are selected so as to form each of the sublayers 12a and 12b.

In accordance with the invention, the thickness of the optical recording layer, which includes the first and second sublayers and the reflective layer, are selected such that the $R_{min}$ relfectivity of the recording element is about or greater than 70% for a laser wavelength of about 780 nm.

More particularly, the first sublayer 12a is selected to have a predetermined thickness by sputtering at least two elements having Ge and Te, or alloys thereof, in an flowing environment of a hydrocarbon gas and an inert gas wherein the flow rate of the hydrocarbon gas is selected relative to the flow rate of the inert gas to provide the first sublayer with an elemental $R_{min}$ reflectivity is in a range of 40–60%.

The second sublayer 12b is formed in a similar manner on the first sublayer 12a and so the details need not be set forth. Frequently in practicing the present invention, the second sublayer 12b will be selected to be of a predetermined thickness and is formed by sputtering at least two elemental targets having Ge and Te, or alloys thereof, in a flowing environment of hydrocarbon gas and the inert gas with the flow rates of the hydrocarbon gas and the inert gas being substantially the same as when the first sublayer was formed and reducing the sputtering rate of the metal elements in comparison to that used when forming the first sublayer so that the elemental $R_{min}$ reflectivity of the second sublayer is in the range of about 70–85%.

After this test is run, then second sublayers 12b can be formed on the first sublayer 12a before forming the reflective layer 14.

The elemental reflectivity of the first sublayer 12a is measured in the following manner. A reflective layer, such as gold, is formed on the first sublayer 12a and the reflectivity then is measured by illuminating the first sublayer through the substrate 10 using a spectrophotometer at 780 nm. For purposes of this disclosure, the reflectivity as measured of the first sublayer will be called "elemental reflectivity" since a reflective layer is actually added onto the first sublayer. Of course, the final device would not have a reflective layer on the first sublayer, but this is necessary in order to characterize the first sublayer. After this test is completed, the first sublayer can be replicated on numerous substrates without using the reflective layer. In a similar fashion, the elemental reflectivity of the second sublayer 12b is measured. In other words, a reflective layer is added onto the second sublayer after it had been directly deposited on the substrate. This will also be termed "elemental reflectivity."

In general, the first sublayer will be selected so as to have a lower elemental $R_{min}$ reflectivity than the second sublayer. However, the two layers, when combined, will produce a reflectivity for the recording element (when it has a reflective layer on second sublayer) of about or greater than 70%. With these criteria, most of the light will be absorbed in the first sublayer. Moreover, the thermal properties of the sublayers 12a and 12b are different. It is believed that the sublayer 12b has a lower thermal conductivity than sublayer 12a. In this way, the sublayers 12b acts as an insulator or heat barrier to prevent the recording energy to be dissipated through the highly conductive reflecting layer.

Protective layers may also be used but will not be discussed since they are not necessary for the practice of this invention. The substrate 10 is transparent and light which illuminates the optical recording layer 12 passes through the substrate 10.

Recording is accomplished by absorbing energy focused on the sublayers 12a and 12b with a write laser. The focused laser beam heats the optical recording element to temperatures substantially above the room temperature and induces changes in the media. The likely changes may include agglomeration of the metallic components in the layer, or the dissociation of material to form gaseous species which, in turn, causes the deformation of the media package in the form of bubbles, voids, or pits, etc. Some distortion of the substrate 10 material might also be induced. In any event, the combination of some or all of these changes forms marks which can then be read back by the focused read laser beam. The record thus consists of marks of relatively low reflectivity on a background of relatively high reflectivity in relation to the read laser light.

The preferred embodiment of the optical recording element is that of a writable compact disc (CD-R). The write and read lasers are of the laser diode type and generally operate in the infrared region between 770 and 830 nm.

For a more complete explanation of the optical recording and play back processes as well as the construction of compact discs, see *Optical Recording*, Allan B. Marchant (1990).

The substrate 10

The substrate 10 can be made from optically transparent resins or glass as discussed above with or without surface treatment. The preferred resins for the FIG. 2 embodiment are polycarbonate and polyacrylates. The substrate 10 may include a guide groove for laser tracking.

The Reflective Layer 14

The reflecting layer 14 can be any of the metals conventionally used for optical recording materials. Useful metals can be vacuum evaporated or sputtered and include gold, silver, aluminum, copper, and alloys thereof. Gold is the preferred material.

The preferred method of fabrication for the sublayers 12a and 12b is DC sputtering. The preferred target contains both the Te and Ge. The targets can be prepared by melt casting or powder metallurgy techniques. Alternatively, a co-sputtering method can be used where two or more sputtering targets are used, some contain the Te and some Ge. The atmosphere contains a sputter gas such as Ar, and a hydrocarbon gas such as methane.

Layers containing Ge, Sb, Te, C, and H have been fabricated for optical applications ((Okawa Japanese Kokai 171,289 (1990), U.S. Pat. No. 4,985,349, and European Patent Application 0290009 (1988)). These layers were designed, however, to be used for an optical recording layer 12 without reflectors. For such applications, it is desirable to have layers which are highly absorbing. For example, Okawa teaches the use of layers made with Q<35%, where $Q=CH_4/(Ar+CH_4)$ is the fraction of $CH_4$ in the sputter gas. Okawa in European Patent Application 0290009 (1988) reported that for a layers fabricated with Q=50% and any of the metals in a long list including Te, Ge, and Sb, the complex optical index is about 3.7–0.59i. That layer, if incorporated in a structure as in FIG. 3, gives only 5.6% reflectance at the first interference minimum and 44.5% reflectance at the first maximum. These low reflectivity values are inadequate for CD applications. Layers made with lower Q values such as those suggested by Okawa are said to be even more absorbing and obviously not suitable for CD applications. Furthermore FIG. 5 of U.S. Pat. No. 4,985,349 clearly indicated that it was not possible to produce layers with (C+H) content higher than 40 atomic % even when a sputtering atmosphere consisted entirely of $CH_4$ (i.e., Q=100%). One skilled in the art will conclude from these teachings, therefore, that it is not possible to produce a layer based on Ge, Te, Sb, C, H with optical constants suitable for CD applications even when a reflector is applied.

For the fabrication of each of the sublayers 12a and 12b, a GeTe alloy target was sputtered in an atmosphere comprising $CH_4$ and/or other hydrocarbons. Two alloy targets can also be used when forming each of the sublayers. This is advantageous since the sublayers can be deposited more rapidly and can have more uniformity in thickness; however, each of the sublayers could also have been formed by simultaneous sputtering from two targets, each with only one element. A reflecting layer 14 was sputter deposited in an inert gas ambient.

In order to achieve the required reflectivity of about or greater than 70% for the recording element, the target power and the flow rate and pressure of the reactive gas have to be controlled during the deposition of the recording layer so that the recording element meets the CD specified reflectivity (>70%).

TABLE 1

| | Sublayer 12a and 12b | | Sublayer 12a | | | Sublayer 12b | | | Element property | |
|---|---|---|---|---|---|---|---|---|---|---|
| Recording element | Ar SCCM | CH4 SCCM | GeTe Target #1 Watt | GeTe Target #2 Watt | Thickness A | GeTe Target #1 Watt | GeTe Target #2 Watt | Thickness A | Reflectivity % | ORP mW |
| 1 | 10 | 20 | 100 | 100 | 100 | 100 | 0 | 300 | 69 | 11 |
| 2 | 10 | 20 | 100 | 100 | 100 | 100 | 0 | 400 | 69.7 | 10 |
| 3 | 10 | 20 | 100 | 100 | 100 | 100 | 0 | 500 | 73 | 11 |
| 4 | 10 | 20 | 100 | 100 | 100 | 100 | 0 | 600 | 77 | 15 |

Figure 4:
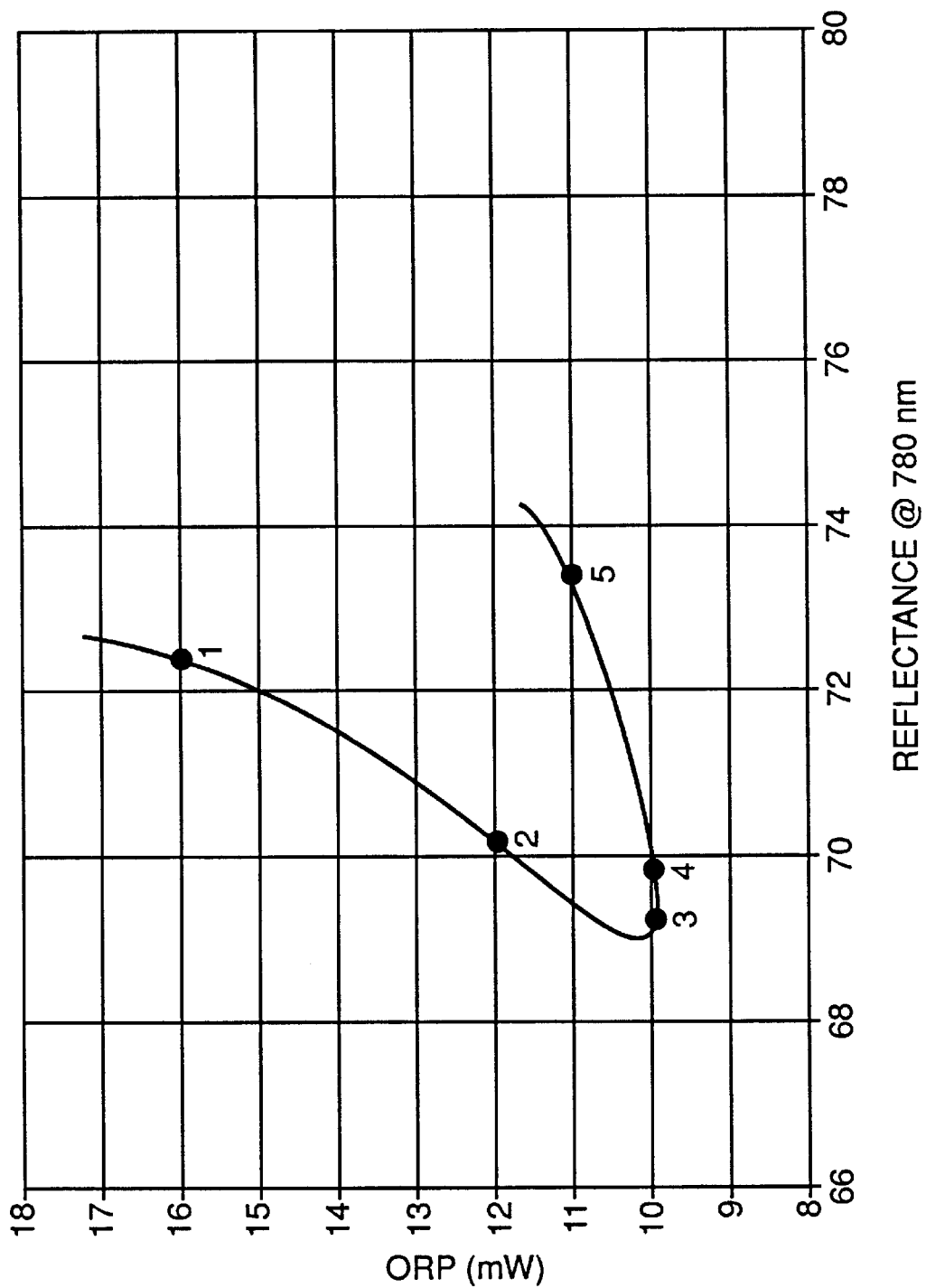
FIG. 4 is a plot of optimum recording power vs. reflectance of an optical recording element made in accordance with the present invention.

Turning now to FIG. 4 where a plot is shown of the optimum recording power vs. reflectance for a bilayer (sublayers 12a and 12b) recording element formed in the process described above wherein the second sublayer 12b is formed with the same flow rates as when the first sublayer 12a was formed. In this case the power of the DC magnetron cathodes 24a and 24b was changed relative to that used during the preparation of the sublayer 12a.

In FIG. 4, this plot is supported by data shown in Table 1. Four separate elements were produced. As shown, two separate GeTe alloy targets, each operating at 100 W, were used to produce sublayer 12a, whereas only a single target was used to produce sublayer 12b. For the first sublayer 12a, 100 W were applied to each GeTe alloy target. In forming sublayer 12a, the flow rate of methane was selected to be 20 SCCM and the flow rate of Ar was selected to be 10 SCCM. In all the elements that were produced, the thickness of the sublayer 12a was selected to be 100 521 . Only a single GeTe alloy target operating at 100 W was used for forming sublayer 12b. The thickness of the sublayer 12b was varied. The same conditions were used to sputter the alloy target for the sublayer 12b as for sublayer 12a, except that only a single target was used. By varying the thickness of sublayer 12b, the recording elements were produced which had different reflectivities. In FIG. 4, both elements 1 and 2 were substantially acceptable as they had low ORP and a reflectivity of about 70%. Using the parameters discussed above with respect to Table 1, a recording element of reflectivity of 69% with an ORP of 10.4 mW at 2.4 m/s can be realized. Of course, it is desirable to adjust the parameters slightly to have the lowest possible ORP with $R_{min}$ for the recording element being at least 70%.

The invention has been described in detail with particular reference to certain preferred embodiments thereof, but it will be understood that variations and modifications can be effected within the spirit and scope of the invention.

| PARTS LIST | |
|---|---|
| 10 | substrate |
| 12a | first sublayer |
| 12b | second sublayer |
| 14 | reflective layer |
| 22 | belljar |
| 24a | magnetron cathode |
| 24b | magnetron cathode |
| 26a | power supply |
| 26b | power supply |
| 28 | substrate holder |
| 30a | gas source |
| 30b | gas source |
| 32a | mass flow controller |
| 32b | mass flow controller |
| 34 | turbomolecular pump |
| 36 | mechanical pump |

We claim:

1. A method of forming a recordable element including a substrate and having on its surface, in order, an optical recording layer and a light reflecting layer, the optical recording layer having at least two sublayers of different compositions, comprising the steps of:

a) forming in a sputtering chamber on the substrate surface a first sublayer of a predetermined thickness by sputtering at least two metal elements having Ge and Te, or alloys thereof, in a flowing environment of a hydrocarbon gas and an inert gas wherein the flow rate of the hydrocarbon gas is selected relative to the flow rate of the inert gas to provide the first sublayer with an elemental $R_{min}$ reflectivity is in the range of 40–60%;

b) forming in the sputtering chamber on the first sublayer a second sublayer of a predetermined thickness by sputtering at least two elements having Ge and Te, or alloys thereof, in a flowing environment of hydrocarbon gas and the inert gas, with the flow rates of the hydrocarbon gas and the inert gas being substantially the same as when the first sublayer was formed and reducing the sputtering rate of the metal elements in comparison to that used when forming the first sublayer so that the elemental $R_{min}$ reflectivity of the second sublayer is in the range of about 70–85%;

c) forming a reflecting layer on the second sublayer; and d) selecting the thicknesses of the first and second sublayers, and the reflecting layer such that the reflectivity of the recording element is about or greater than 70% for a laser wavelength of about 780 nm.

2. The method of claim 1 wherein the first sublayer is formed by sputtering from two separate GeTe targets and the second sublayer is formed by sputtering from a single GeTe alloy target with the sputtering power being lower for the second sublayer than for the first sublayer while the flow rates of the hydrocarbon gas is the same for the first and second sublayers.

3. The method of claim 1 wherein the reflecting layer forming step includes the step of sputtering elements selected from the group consisting of Au, Ag, Cu, Al, and alloys thereof.

4. The method of claim 1 wherein the two sublayers of different compositions being selected such that each of them have different thermal and optical properties.

5. The method of claim 1 wherein the first sublayer is adjacent to the substrate has a lower hydrocarbon content than the sublayer adjacent to the reflecting layer.

6. The method recording element of claim 1 wherein the substrate is polycarbonate.

* * * * *